United States Patent
Chen et al.

[11] Patent Number: 6,159,662
[45] Date of Patent: Dec. 12, 2000

[54] PHOTORESIST DEVELOPMENT METHOD WITH REDUCED CYCLE TIME AND IMPROVED PERFORMANCE

[75] Inventors: Yung-Hsiang Chen, Taichung; Yung-Dar Chen, Hsin-Chu, both of Taiwan

[73] Assignee: Taiwan Semiconductor Manufacturing Company, Hsin-Chu, Taiwan

[21] Appl. No.: 09/312,600

[22] Filed: May 17, 1999

[51] Int. Cl.[7] ........................................... G03F 7/30
[52] U.S. Cl. ............................................. 430/313
[58] Field of Search ................................. 430/313

[56] References Cited

U.S. PATENT DOCUMENTS

| | | | |
|---|---|---|---|
| 4,564,280 | 1/1986 | Fukuda | 354/317 |
| 4,710,449 | 12/1987 | Lewis et al. | 430/326 |
| 5,194,350 | 3/1993 | Matsuoka | 430/30 |
| 5,223,083 | 6/1993 | Cathey et al. | 430/313 |
| 5,292,605 | 3/1994 | Thomson | 430/30 |
| 5,591,654 | 1/1997 | Kishimura | 437/26 |
| 5,773,200 | 6/1998 | Okazaki et al. | 430/324 |
| 5,789,141 | 8/1998 | Usujima | 430/313 |

FOREIGN PATENT DOCUMENTS

| | | |
|---|---|---|
| 402010824 | 1/1990 | Japan . |

OTHER PUBLICATIONS

Badih El–Kareh, "Fundamentals of Semiconductor Processing Technologies", Kluwer Academic Publiushers, Boston, (1995), pp. 210–211.

*Primary Examiner*—Hoa Van Le
*Attorney, Agent, or Firm*—George O. Saile; Stephen B. Ackerman

[57] ABSTRACT

A method for developing a photoresist pattern on a semiconductor wafer using the puddle method is described, wherein the wafer is subjected to several periods of slow rotation while the puddle is in place on the wafer, The process also embraces an improved wafer-to-wafer uniformity of development. A step by step example of the process is given wherein a TMAH developer is used. Two developer puddle applications are used and each puddle undergoes three 2 second rotation periods at 20 rpm., each followed by a 4 second idle period. The intermittent puddle rotations improve the uniformity of development over the wafer thereby improving the uniformity and accuracy of critical dimensions in the resultant pattern. Although the process induced defect densities remain about the same, the sizes of the defects is reduced. In addition, the improved process reduces the overall development cycle time by about 34 percent.

8 Claims, 5 Drawing Sheets

PHOTORESIST DEVELOPMENT METHOD WITH REDUCED CYCLE TIME AND IMPROVED PERFORMANCE

BACKGROUND OF THE INVENTION (1) Field of the Invention

The invention relates to processes used in semiconductor manufacturing technology and more particularly to processes related to development of photoresist masks.

(2) Background of the Invention and Description of Previous Art

Integrated circuits (ICs) are manufactured by first forming discrete semiconductor devices within the surface of silicon wafers. A multi-level metallurgical interconnection network is then formed over the devices contacting their active elements and wiring them together to create the desired circuits. Patterning of the devices elements within the semiconductor surface as well as those lying above the surface such as polysilicon gates and the wiring levels and their via/contact interconnections are typically accomplished by photolithography. Indeed, the photolithography sector is perhaps the most abundant, crucial, and most sensitive in the entire chip manufacturing process. It is here where the pattern definition limits of the state of the art are defined. Photolithographic masks are formed by depositing a layer of photosensitive material, referred to as photoresist, and forming an image in the layer by selectively exposing to radiation, either by scanning, or by means of an optical mask. The image in the exposed photoresist layer is then chemically developed, to form a physical pattern.

There are three widely recognized methods of photoresist development—spin development, spray development, and puddle development. In spin development the wafer is rotated on a pedestal as the developer is dispensed onto it through a nozzle or multiple nozzles. This method is similar to the method by which the photoresist is applied. Following development, the wafers are rinsed with DI (de-ionized water), and dried while the wafer is spinning. Spray development applies a fine mist, usually from multiple nozzles, onto a single stationary wafer or onto a plurality of wafers residing in a cassette.

More recently, static "puddle" development has become widely used. In this new technique, the developer is slowly dispensed onto the surface of a wafer. The wafer may be rotated at slow speed as the developer is dispensed. Once the developer has been delivered, the wafer remains stationary for the duration of the development cycle, typically for about 60 seconds. After development the wafer is rinsed and spun dry. The newest resist formulations are optimized for puddle processing, resulting in improved control of uniformity and minimal consumption of chemicals (See El-Kareh, B., "Fundamentals of Semiconductor Processing Technologies", Kluwer, Boston, (1995), p210–211).

Matsuoka, U.S. Pat. No. 5,194,350 shows an apparatus for developing an exposed photo emulsion on a chromium layer on a glass substrate. The developer solution is dispensed into a developing vessel immersing the substrate which rests, within the vessel, upon a rotatable table. The substrate is not rotated or spun during development but is subsequently spun in a rinse and dry step.

Kishimura, U.S. Pat. No. 5,591,654 deposit thick (3–6 micron) photoresist layers which are patterned to serve as high energy ion implantation masks. After exposure, the thick photoresist layers are baked and developed by a puddle development process for 100 seconds using an NMD developer. Fukuda, U.S. Pat. No. 4,564,280 shows an apparatus which includes a rotatable table and developer dispensing arm which is used for static puddle development. In use developer is dispensed from nozzles while the wafer rotates at a relatively high speed. At the end of the dispensing, the wafer is rotated one more turn at reduced speed and then stopped. The wafer remains stopped for the remainder of the development cycle. Usujima, U.S. Pat. No. 5,789,141 cites a method of photoresist development wherein the developer is placed upon a wafer and retained by surface tension. However, there is no suggestion that the developer, so placed, undergoes any manner of agitation.

Okazaki, et. al., U.S. Pat. No. 5,773,200 cites a positive resist composition developed by development in an aqueous solution of TMAH (tetramethyl ammonium hydroxide).

Thompson, U.S. Pat. No. 5,292,605 cites multiple spray/puddle steps for developing a photoresist image. An optical endpoint controller is used to control the development time. Developer is sprayed onto the wafer and allowed to puddle. After a time interval more developer is sprayed onto the wafer, forming a new puddle. This method, although providing intermittent replenishment on the wafer surface during the development cycle, nevertheless wastes expensive developer.

The effectiveness of any development recipe can be ascertained by the measurements of the dimensions and integrity of the resultant photoresist images, measurements of defects introduced by the process, and the time efficiency and the process complexity and cost. Once a procedure has been established, optimization procedures are generally employed to tweak process times, temperatures, rotational speeds and the like to give the best quality images with minimal cycle time and cost. An example of a photoresist development process which uses the puddle method is illustrated in Table I. The process utilizes two static puddle development periods with a developer spin off step between. Prior to each development period, the developer is dispensed onto the rotating wafer to form a puddle. The wafer is then stopped and is allowed to remain motionless for the duration of the development period. After the development period is over, the wafer is rotated and the developer puddle is spun off the wafer. A two step rinse and spin dry process then follows to complete the process. The total cycle time for the process as shown is approximately 3 minutes.

TABLE I

| | | Reference Process | | |
|---|---|---|---|---|
| Step | Time[1] | Rotation[2] | Accel.[3] | Operation |
| 1 | 3.5 | 1,500 | 10,000 | Rotate Wafer |
| 2 | 3 | 1,500 | 10,000 | Dispense DI Water |
| 3 | 3 | 1,500 | 10,000 | Spin Dry |
| 4 | 3 | 0 | 1,000 | Idle |
| 5 | 0.1 | 10 | 1,000 | Dispense Developer |
| 6 | 1.5 | 60 | 1,000 | Dispense Developer |
| 7 | 25 | 0 | 1,000 | First Develop (system exhaust off) |
| 8 | 2 | 1,000 | 1,000 | Spin Dry (system exhaust back on) |
| 9 | 5 | 0 | 1,000 | Air Vent (Prime developer nozzle) |
| 10 | 2 | 60 | 1,000 | Dispense Developer |
| 11 | 3 | 0 | 1,000 | Auto Damper (system exhaust off) |
| 12 | 35 | 0 | 1,000 | Second Develop |
| 13 | 5 | 0 | 1,000 | Idle |
| 14 | 10 | 2,000 | 10,000 | DI Water Rinse (system exhaust back on) |
| 15 | 15 | 1,200 | 10,000 | DI Water Rinse |
| 16 | 6 | 600 | 10,000 | DI Water Rinse |
| 17 | 3 | 5,000 | 10,000 | Spin Dry |
| 18 | 3 | 3,500 | 10,000 | Spin Dry |

TABLE I-continued

Reference Process

| Step | Time[1] | Rotation[2] | Accel.[3] | Operation |
|---|---|---|---|---|
| 19 | 1 | 1,000 | 10,000 | Spin Dry |
| 20 | 5 | 0 | 10,000 | Idle Wash |
| 21 | 10 | 2,000 | 10,000 | DI Water Rinse |
| 22 | 15 | 1,200 | 10,000 | DI Water Rinse |
| 23 | 6 | 600 | 10,000 | DI Water Rinse |
| 24 | 3 | 5,oo0 | 10,000 | Spin Dry |
| 25 | 6 | 4,000 | 10,000 | Spin Dry |
| 26 | 4 | 3,000 | 10,000 | Spin Dry |
| 27 | 2 | 2,000 | 10,000 | Spin Dry |
| 28 | 2 | 1,000 | 10,000 | Spin Dry |
| 29 | 2.5 | 0 | 10,000 | Stop |
| Total | 184.6 | | | |

[1]In seconds
[2]In rpm (revolutions per minute)
[3]In rpm/sec.

Although the development process shown in Table I, is workable, It would be desirable to reduce the turn around time and therefore speed production. In addition, it would also be desirable to improve the dimensional uniformity of pattern features across a wafer and from wafer to wafer as well to reduce process related defect degradation.

SUMMARY OF THE INVENTION

It is an object of this invention to provide an improved method for developing an exposed photoresist layer which reduces the development process cycle time thereby improving product throughput.

It is another object of this invention to provide an improved method for developing an exposed photoresist layer which reduces the yield impact of random and process related defects.

It is yet another object of this invention to provide a method for developing an exposed photoresist layer which gives improved dimensional uniformity of the developed photoresist image as measured across the wafer and from wafer to wafer.

It is another object of this invention to provide a method for developing an exposed photoresist layer which reduces the size of process related defects.

It is yet another object of this invention to provide a method for reducing the amount of developer used to develop of an exposed photoresist layer.

These objects are accomplished by introducing a plurality of short slow wafer rotation periods during each puddle cycle. The period and speed of rotation is so short that the wafer need not even undergo a full rotation. The rotational motion imparts a slight lateral movement of the developer at the wafer/developer interface which causes local displacement of partially spent developer from within the developing image pockets and replaces it with fresh developer. This occurs, primarily at the start and stop of the wafer rotation. The fluid developer trying to remain static, resists the wafer acceleration and deceleration, causing a short local displacement of the liquid. The total development time is not changed.

The brief rotations also reduce the settlement or agglomeration and adherence of particulates onto the wafer surface. This permits the elimination of one of the two rinse/spin steps without increasing the defect count, thereby significantly decreasing the total development process time. Although the defect count is not appreciably diminished by the disclosed process, the average defect size is noticeably reduced.

Measurement of image quality shows an improvement in image dimensional uniformity as well as greater stability. In addition, the effective chemical reaction of the developer is improved because the volume of developer used per puddle can be reduced because the developer performance is determined by effective chemical reaction and not total volume.

DESCRIPTION OF THE PREFERRED EMBODIMENTS

In an embodiment of this invention an in-process silicon wafer is provided. A metal layer has been deposited on the wafer. The metal layer is to be patterned by photolithography to form a wiring level of an integrated circuit. A photoresist layer coated onto the metal layer and a latent image of a pattern is formed in the photoresist layer by selective exposure to ultraviolet radiation in a photolithographic stepper. A suitable stepper is the ASML Model 5500/200B. The wafer is then placed on a rotatable table of a photoresist development tool and the pattern defined by the latent image is developed according to the procedure of the invention.

Figure 1A:
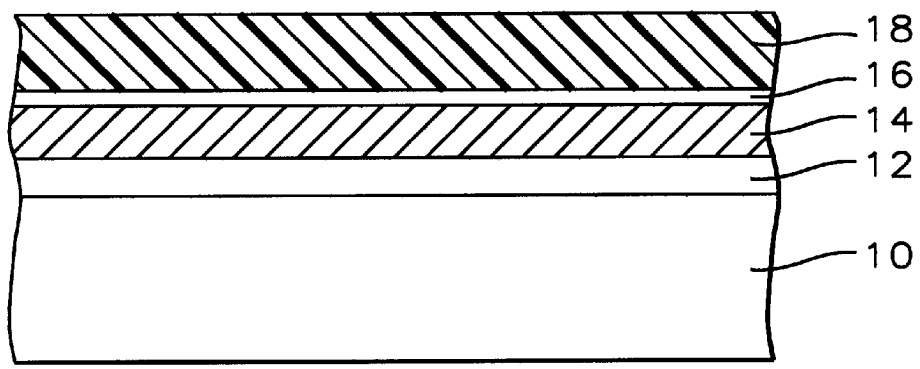
FIG. 1A through FIG. 1D is are cross sections of a portion of an in-process silicon wafer illustrating the process steps wherein the method of the invention is accomplished.

Referring to FIG. 1A, a 200 mm. diameter silicon wafer 10 is provided. Semiconductive devices (not shown) have been formed within the surface of wafer 10 and an insulative layer 12 is formed over the devices. Conductive vias or contacts (not shown) are formed in the insulative layer 12 to provide connections to elements of the subjacent devices. A conductive layer 14 is deposited on the insulative layer 12. The conductive layer in the embodiment is an aluminum alloy, deposited by conventional methods for example vacuum evaporation or by sputtering. Alternatively, other conductive materials may be used in the embodiment, for example copper, tungsten and the like. An ARC (anti-reflective coating) 16 is applied over the metal layer to reduce reflections from the aluminum surface during subsequent photo exposure. A suitable ARC material is a layer of TiN about 500 Angstroms thick deposited by sputtering.

Figure 1B:
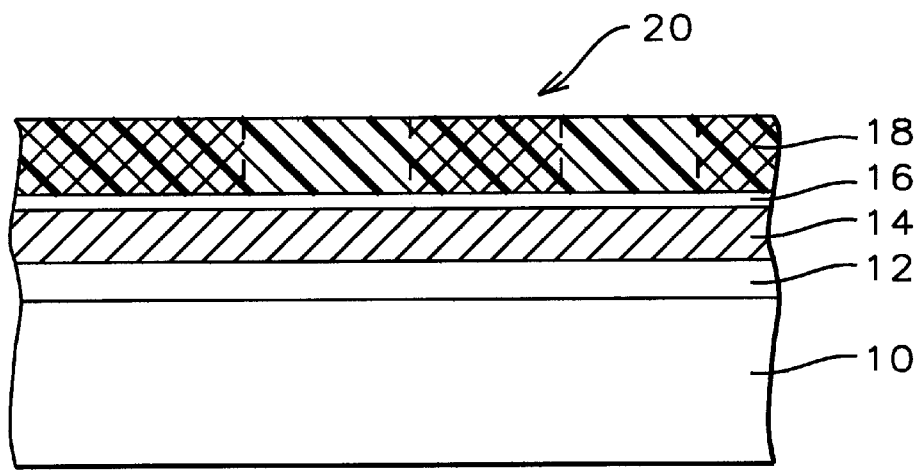

A layer 18 of SEPR 450H photoresist is applied onto the ARC layer 16. The photoresist is applied by a conventional spin coating technique. Alternately, another photoresist formulation, for example AZ4620 manufactured by Hoescht Ltd. or PFI-38A8 may be used. Referring to FIG. 1B, the wafer 10 is next mounted in a stepper wherein the photoresist layer 18 is selectively exposed to ultraviolet radiation through a reticle to form a latent image 20 in the resist. The exposure energy is 19 mJoules or thereabout.

Figure 1C:
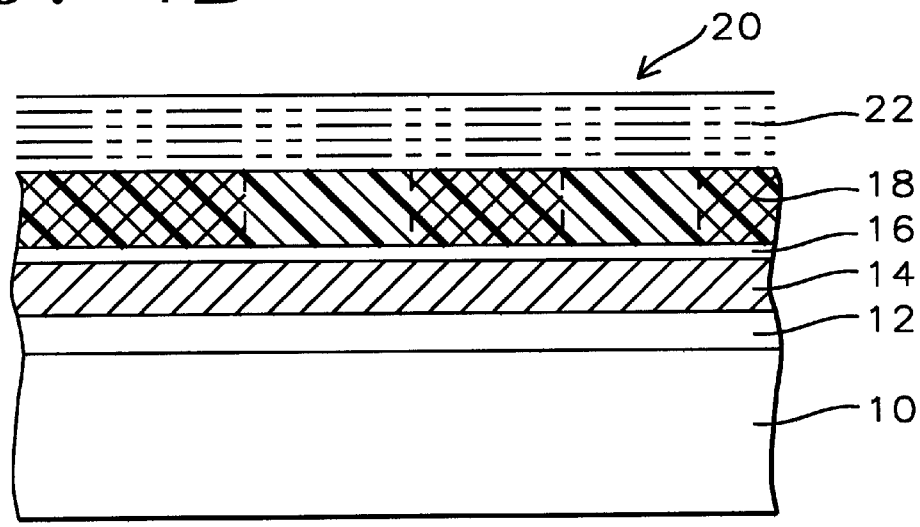
Figure 2:
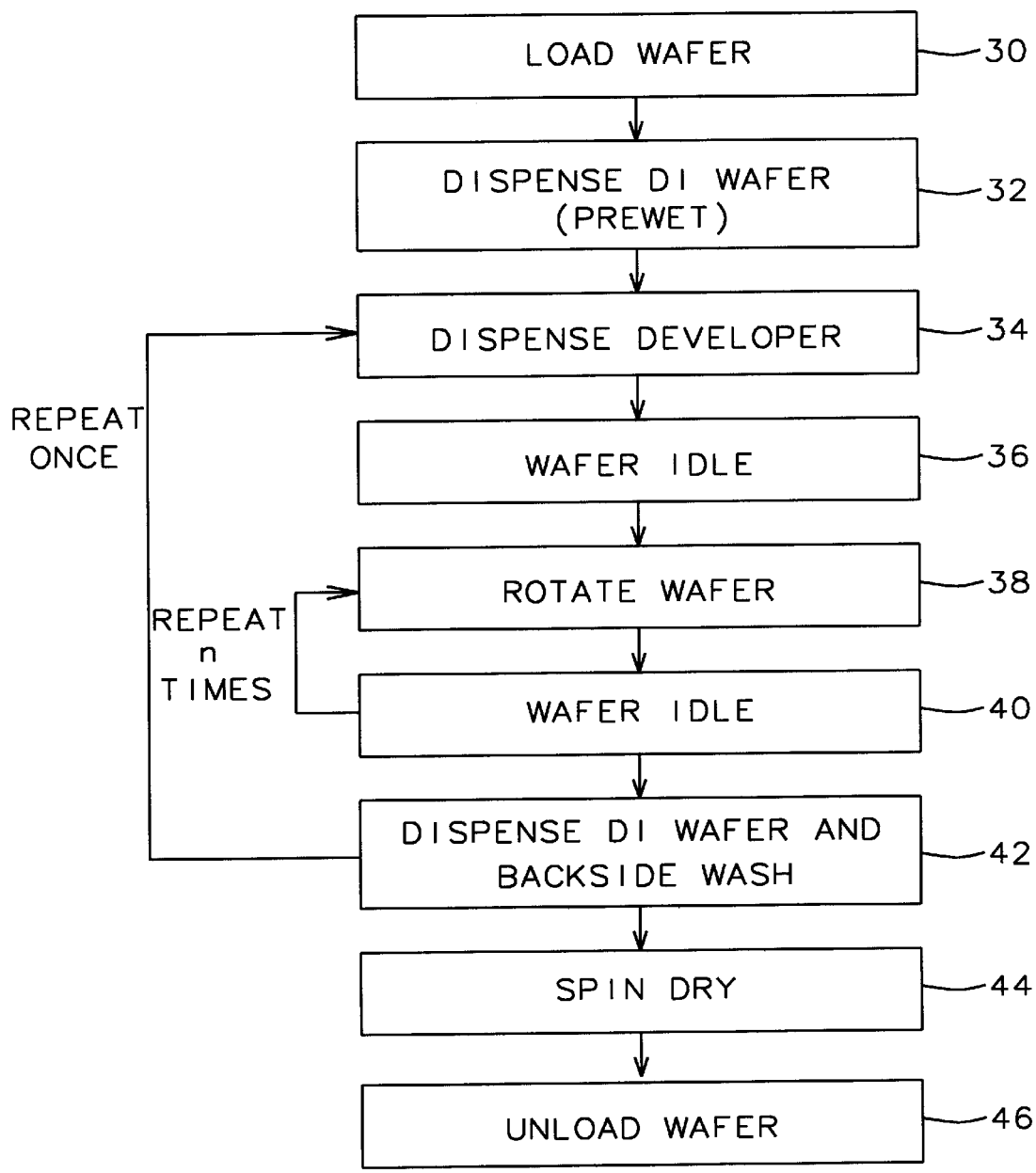
FIG. 2 is a flow chart showing the process steps of the invention.

After exposure by the stepper, the wafer 10 is mounted in a photoresist track processing tool. A suitable tool is the model MARK 8 or the model ACT 8 manufactured by Tokyo Electron Limited of Japan. FIG. 2 is a flow chart showing the sequence of processing steps conducted in the processing tool. The process sequence is also shown in greater detail in Table II. The wafer 10 is mounted 30 (FIG. 2) on a rotatable pedestal in the tool. In steps 1–4 (Table II) the wafer is spun and DI (de-ionized) water is applied to pre-wet 32 (FIG. 2) the photoresist 18. Referring now to FIG. 1C and steps 5–6 of Table II, between about 15 and 35 cc of developer is dispensed 34 (FIG. 2) onto the top surface of the wafer while the wafer slowly rotates, forming a first puddle 22 which covers the photoresist layer 18. The developer used in the embodiment is NMD-W, manufactured by Tokyo Ohka Kogyo Co. Ltd. of Japan. NM-W photoresist developer contains about 2.38 percent TMAH and a surfactant.

In step 7a (Table II), rotation is stopped and the wafer remains idle for a period of about 7 seconds as development begins. The wafer 10 is next rotated 7b (Table II) for a period of about 2 seconds at 20 rpm or thereabout. This amounts to only about a third of a rotation. However, a slight local movement of the developer occurs at the wafer/developer interface which causes displacement of partially spent developer from within the developing image pockets and replaces it with fresh developer. This occurs, primarily at the start and stop of the wafer rotation. The fluid developer trying to remain static by Newton's law, resists the wafer acceleration and deceleration, causing a short local displacement of the liquid.

Figure 3:
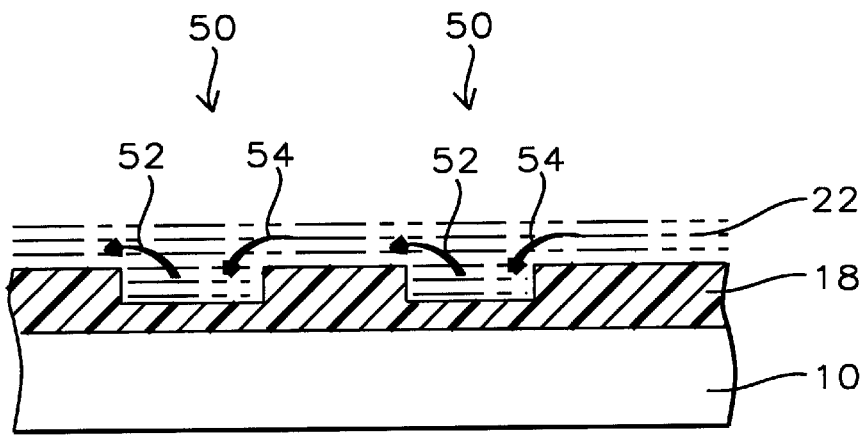
FIG. 3 is a cross section of a partially developed photoresist image showing the motion of liquid developer during wafer rotation according to the method of the invention.

This local displacement or jostling action is illustrated in FIG. 3 where a developer puddle 22 on a section of a partially developed photoresist image 18 is shown. When rotation of the wafer 10 is initiated, moving the section illustrated to the right, depleted developer in the partially developed pockets 50 is displaced to the left as shown by the arrows 52. Fresh developer 54 from the bulk of the solution 22 enters the pockets. When the rotation stops, the direction of the arrows reverses and developer is displaced in the other direction.

TABLE II

| Step | Time[1] | Rotation[2] | Accel.[3] | Operation |
|---|---|---|---|---|
| 1 | 3.5 | 1,500 | 10,000 | Rotate Wafer |
| 2 | 3 | 1,500 | 10,000 | Dispense DI Water |
| 3 | 3 | 1,500 | 10,000 | Spin Dry |
| 4 | 3 | 0 | 1,000 | Idle |
| 5 | 0.1 | 10 | 1,000 | Dispense 1st Developer (1) |
| 6 | 1.5 | 60 | 1,000 | Dispense 1st Developer (2) |
| 7a | 7 | 0 | 1,000 | First Develop Idle (System exhaust off) |
| 7b | 2 | 20 | 10,000 | First Develop 1st Rotate |
| 7c | 4 | 0 | 10,000 | First Develop Idle |
| 7d | 2 | 20 | 10,000 | First Develop 2nd Rotate |
| 7e | 4 | 0 | 10,000 | First Develop Idle |
| 7f | 2 | 20 | 10,000 | First Develop 3rd Rotate |
| 7g | 4 | 0 | 10,000 | First Develop - Idle |
| 8 | 2 | 1,000 | 1,000 | Spin Dry (System exhaust back on) |
| 9 | 5 | 0 | 1,000 | Air Vent (Prime developer nozzle) |
| 10 | 2 | 60 | 1,000 | Dispense 2nd Developer |
| 11 | 3 | 0 | 1,000 | Auto Damper (System exhaust off) |
| 12a | 7 | 0 | 1,000 | Second Develop Idle |
| 12b | 2 | 20 | 10,000 | Second Develop 1st Rotate |
| 12c | 4 | 0 | 10,000 | Second Develop Idle |
| 12d | 2 | 20 | 10,000 | Second Develop 2nd Rotate |
| 12e | 4 | 0 | 10,000 | Second Develop Idle |
| 12f | 2 | 20 | 10,000 | Second Develop 3rd Rotate |
| 12g | 4 | 0 | 10,000 | Second Develop Idle |
| 13 | 5 | 0 | 1,000 | Idle |
| 14 | 12 | 600 | 10,000 | DI Water Rinse (System exhaust back on) |
| 15 | 8 | 1,200 | 10,000 | DI WaterRinse |
| 16 | 12 | 600 | 10,000 | DI Water Rinse |
| 17 | 3 | 1,500 | 10,000 | Spin Dry |
| 18 | 6 | 4,000 | 10,000 | Spin Dry |
| 19 | 4 | 3,000 | 10,000 | Spin Dry |
| 20 | 2 | 2,000 | 10,000 | Spin Dry |
| 21 | 2 | 1,000 | 10,000 | Spin Dry |
| 22 | 2.5 | 0 | 10,000 | Stop |
| Total | 121.6 | | | |

[1] In seconds
[2] In rpm (revolutions per minute)
[3] In rpm/sec.

The rotation is stopped and the wafer again remains stationary for a period of about 4 seconds 7c (Table II). The rotate/idle cycle 38,40 (FIG. 2) is repeated twice more in steps 7d,7e and 7f,7g. The first puddle is then spun off the wafer in step 8–9, completing the first development cycle. The sum of the develop times, for the first development cycle (step 7) is 25 second which is the same as the total time of the single static puddle development of the standard ss shown as step 7 in Table I.

A second development cycle is then begun by dispensing a 25 cc a fresh allotment of NMD-W developer onto the wafer 10. (Steps 10–11) while the wafer rotates slowly at about 60 rpm forming a second puddle. In step 12a (Table II), rotation is stopped and the wafer remains idle for a period of about 17 seconds as development begins. The wafer 10 is next rotated, step 12b (Table II), for about 2 seconds at between about 10 and 40 rpm. The rotation is then stopped and the wafer again remains stationary for a period of between about 2 and 6 seconds 12c (Table 11). This rotate/idle cycle 38,40 (FIG. 2) is repeated twice more in steps 12d,12e and 12f,12g. The second puddle is then washed off the wafer 10 (step 13) with DI water and the wafer is rinsed in DI water (Step 14), completing the first development cycle. The sum of the develop times, for the second development cycle (step 12) is 35 seconds which is the same as the total time of the single static puddle development of the standard process shown as step 12 in Table I. The wafer next receives a sequence of three DI water rinses at rotational speeds of 600, 1,200, and 600 rpm successively (Table II, steps 14–16). The backside of the wafer also receives a wash 42 (FIG. 2).

Figure 1D:
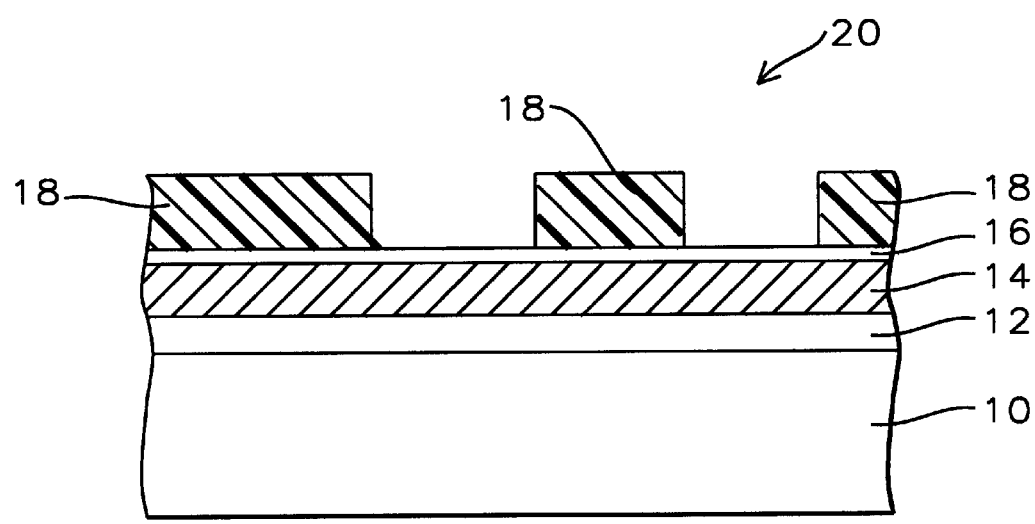

After the third DI water rinse (Table II, step 16), a sequence of five spin dry steps 44 (FIG. 2) are performed beginning at about 1,500 rpm, increasing to about 4,000 rpm (Table II, step 18) and then successively decreasing in 1,000 rpm steps (Table II, steps 19–22) to a stop and the wafer is unloaded 46 (FIG. 2). The patterned photoresist cross section is shown in FIG. 1D.

The total cycle time of the new development process as shown in Table II is 121.6 seconds. Comparing this to the reference process of Table I, which took a total of 184.6 seconds, it may be seen that a reduction in cycle time of about 34% is realized by the new process. The improved quality of the photoresist pattern which results form utilization of the process of the invention is manifested by an improvement in both the accuracy of critical dimensions and uniformity over the wafer of the developed image. The wafer-to-wafer uniformity is also improved.

Figure 4:
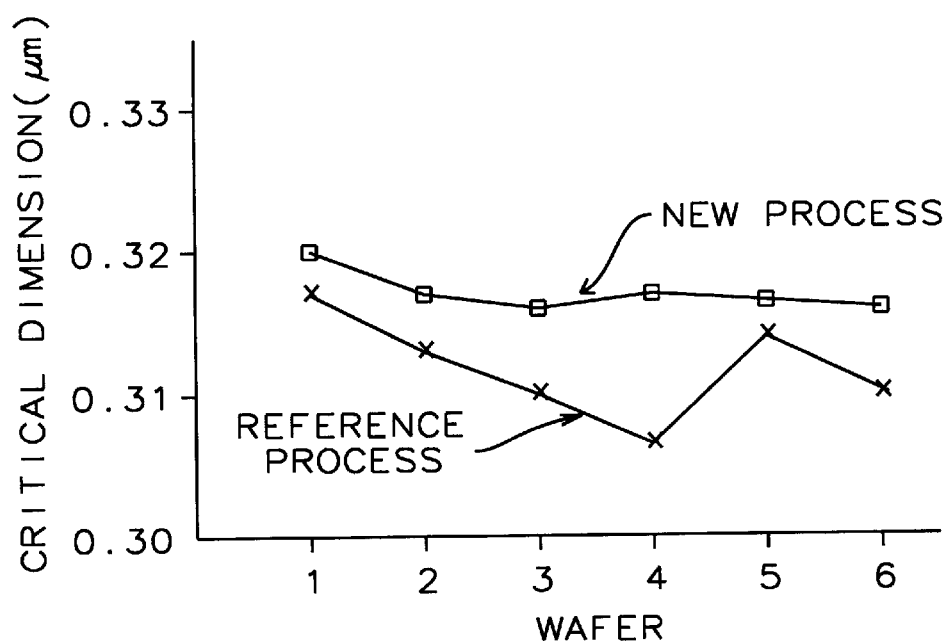
FIG. 4 shows a graph of the mean values of a selected critical dimension on photoresist patterns developed by the method of the invention.

Six wafers were processed by the method of the invention (Table II) and six other wafers were processed by the reference process (Table I). A 0.35 micron bar in the processed image was measured at 22 points on each wafer with an SEM (scanning electron microscope). FIG. 4 shows a graph of the mean values of the selected critical dimension (CD) of the bar on each wafer. The graph clearly shows the improved wafer-to-wafer uniformity as well that the measured values are consistently closer to the design dimension.

Figure 5:
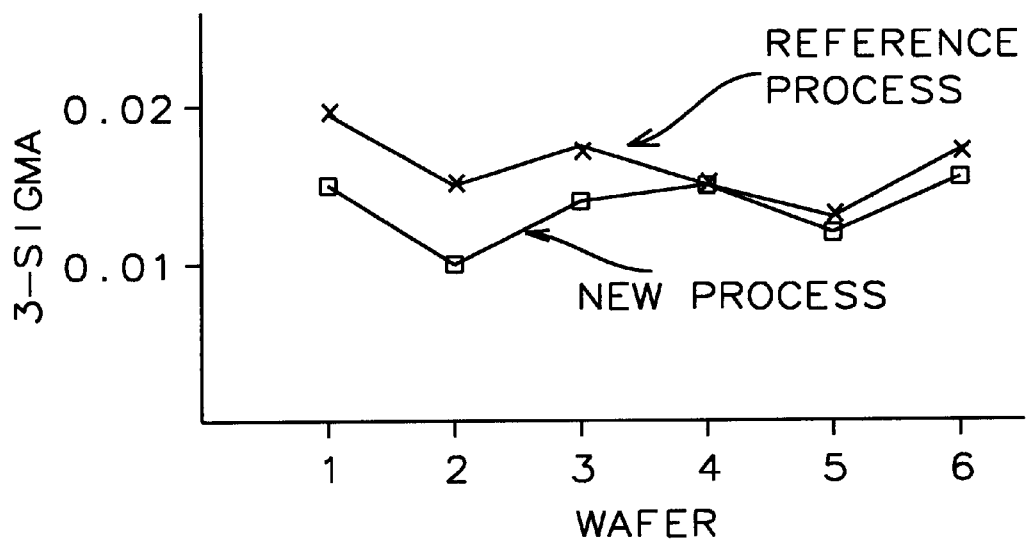
FIG. 5 shows a graph of the 3-sigma values of a selected critical dimension on photoresist patterns developed by the method of the invention.

FIG. 5 is a graph of the corresponding values of the 3-sigma value of the measurement distribution on each of the wafers used in the experiment. Here again the values of 3-sigma for the wafers developed by the process of the invention are consistently lower than those developed by the reference process showing a tighter distribution on each wafer.

In other experiments it was shown that the dispensed volume of developer had no effect on the dimensional statistics over a range of volumes between 13 and 35 cc. Thus it is possible to reduce the developer volume from that used in the embodiments (25 cc) by about 50% without degrading image quality of the developed photoresist.

Defects, such as random particulates defects were investigated by use of a white light oblique scanning methods such as by a KLA scanner. It was found that, although the density of defects introduced by the development process was not noticeably improved by the method of the invention, the average size of these defects was measurably reduced.

The embodiments use silicon wafers. It should be well understood by those skilled in the art that other substrates may also be used and, by applying the procedures taught by this invention, the same objectives may be achieved. While the invention has been particularly shown and described with reference to the preferred embodiments thereof, it will be understood by those skilled in the art that various changes in form and details may be made without departing from the spirit and scope of the invention.

While in the embodiments, three rotate/idle cycles were cited during each of two development periods. It is contemplated that the number of rotate. idle cycles is not limited to a three but could be more or less. Preferably the number of rotate/idle cycles is between 3 and 5. The relative lengths of time of the rotate and idle steps is also not restricted to the times cited in the embodiments, but may be varied as well. Clearly, it is contemplated that photoresist formulations, other than those used in the embodiments may be utilized which will require different development times than those cited in the embodiments.

What is claimed is:

1. A method for developing a photoresist layer on a wafer comprising the steps of:
   (a) providing a wafer having a photoresist layer;
   (b) selectively exposing said photoresist layer to radiation, thereby forming a latent image in said layer;
   (c) mounting said wafer on a rotatable table of a photoresist processing tool;
   (d) pre-wetting said photoresist layer by dispensing DI water onto said photoresist layer while said wafer is spun;
   (e) spin drying said photoresist layer;
   (f) dispensing a first puddle of developer onto the surface of said photoresist layer;
   (g) pausing said wafer for a first time period;
   (h) rotating said wafer at a first spin rate for a second time period;
   (i) pausing said wafer for a third time period;
   (j) repeating steps (h) and (i) successively a first number of times;
   (k) spinning off said first puddle;
   (l) dispensing a second puddle of developer onto the surface of said photoresist layer;
   (m) pausing said wafer for a fourth time period;
   (n) repeating steps (h) and (i) successively a second number of times;
   (o) washing off said second puddle;
   (p) spin rinsing said wafer with DI water;
   (q) spin drying said wafer; and
   (r) dismounting said wafer.

2. The method of claim 1 wherein said developer contains about 2.38% tetramethyl ammonium hydroxide.

3. The method of claim 2 wherein said first number of times and said second number of times is between 2 and 4.

4. The method of claim 1 wherein said second time period is 2 seconds or thereabout.

5. The method of claim 1 wherein said first spin rate is between about 10 and 40 rpm.

6. The method of claim 1 wherein said third time period is between about 2 and 6 seconds.

7. The method of claim 1 wherein said first time period is greater than said fourth time period.

8. The method of claim 1 wherein said wafer is 200 mm. in diameter and the volume of said first puddle and the volume of said second puddle is between about 13 and 35 cc.

* * * * *